(12) United States Patent
Lee

(10) Patent No.: US 7,584,071 B2
(45) Date of Patent: Sep. 1, 2009

(54) REMOTE-CONTROLLED MOTION APPARATUS WITH SENSING TERRESTRIAL MAGNETISM AND REMOTE CONTROL APPARATUS THEREFOR

(76) Inventor: Yu-Tuan Lee, 10F-A, No. 148, Sec 2, Fu-Hsing S Rd, Taipei 106 (TW)

( * ) Notice: Subject to any disclaimer, the term of this patent is extended or adjusted under 35 U.S.C. 154(b) by 0 days.

(21) Appl. No.: 12/051,662

(22) Filed: Mar. 19, 2008

(65) Prior Publication Data

US 2008/0234971 A1 Sep. 25, 2008

(30) Foreign Application Priority Data

Mar. 23, 2007 (TW) .............................. 96110077 A

(51) Int. Cl.
*G06F 19/00* (2006.01)
(52) U.S. Cl. ..................... 702/150; 702/188
(58) Field of Classification Search ................... 701/26; 702/150, 188
See application file for complete search history.

(56) References Cited

U.S. PATENT DOCUMENTS 6,351,698 B1 * 2/2002 Kubota et al. .................. 701/51

2005/0171637 A1 * 8/2005 Tani et al. .................... 700/245
2006/0173577 A1 * 8/2006 Takeda et al. ................ 700/245

* cited by examiner

Primary Examiner—Edward R Cosimano
Assistant Examiner—Douglas N Washburn
(74) Attorney, Agent, or Firm—Birch, Stewart, Kolach & Birch, LLP

(57) ABSTRACT

A remote-controlled motion apparatus is controlled by a remote control apparatus. The remote control apparatus transmits a target motion signal by radio. The remote-controlled motion apparatus includes a communication module, a terrestrial magnetism sensing module, a processing module and a driving module. The communication module receives the target motion signal from the remote control apparatus. The terrestrial magnetism sensing module senses a terrestrial magnetism of the remote-controlled motion apparatus to output a terrestrial magnetism sensing signal. The processing module is coupled with the terrestrial magnetism sensing module and the communication module, and processes the terrestrial magnetism sensing signal and the target motion signal to output a driving control signal. The driving module is coupled with the processing module to receive the driving control signal, and adjusts the driving of the remote-controlled motion apparatus according to the driving control signal.

15 Claims, 5 Drawing Sheets

REMOTE-CONTROLLED MOTION APPARATUS WITH SENSING TERRESTRIAL MAGNETISM AND REMOTE CONTROL APPARATUS THEREFOR

CROSS REFERENCE TO RELATED APPLICATIONS

This Non-provisional application claims priority under 35 U.S.C. §119(a) on patent application Ser. Nos. 096110077 filed in Taiwan, Republic of China on Mar. 23, 2007, the entire contents of which are hereby incorporated by reference.

BACKGROUND OF THE INVENTION

1. Field of Invention

This invention relates to a remote-controlled motion apparatus which includes a remote-controlled device and a remote controller.

2. Related Art

Conventional remote control system uses a remote controller and a remote-controlled device, the user operates the remote controller to control the motion of the remote-controlled device. As shown in the FIG. 1 a remote controller 1 includes a manual input module 11 and a communication module 12, the manual input module 11 includes a stick and a variable resistor, the user uses the stick to move the variable resistor and change its resistance, and to generate different voltage output for every different stick positions. The output voltage, which is called the control signal $S_{CNT}$, uses different voltage levels to represent different input data, the communication module 12 connects to the input module 11's output and transmits the control signal $S_{CNT}$.

A remote-controlled model airplane 2 includes a communication module 21, a controller 22, a motor 23 and a rear fin 24, the communication module 21 receives the control signal $S_{CNT}$ which is transmitted from the remote controller 1, the controller 22 connects to the communication module 21 and controls the motor 23 (or servo) according to the received control signal $S_{CNT}$, the motor 23 connects to the rear fin 24 and changes the angle of the rear fin 24, as a result the model airplane 2's flying attitude is controlled and changed. In most designs, the rear fin's angle is synchronized to the stick position of the remote controller 1, that is, the rear fin's angle is controlled by the voltage level of the control signal $S_{CNT}$.

Generally the remote controller uses a stick to control a switch or change a variable resistor's resistance to generate control signals, these kinds of controlling methods can only generate two X and Y axes control signals by one hand, if a 3-D X, Y and Z axes control is needed, two hands are required for control or extra switches are needed to switch the control, it requires two hands to control simultaneously and it's not an easy task at all. And since the stick is used to control the rear fin, which means the larger angle of the stick generates the larger angle at the rear fin, this kind of control method requires the user to use their own eyes to identify the resulting motion of the controlled aircraft and adjust the angle immediately, which makes it even more difficult to control.

SUMMARY OF THE INVENTION

Regarding the above-mentioned problems, it is an objective of the invention to provide a terrestrial magnetism self-sensed control apparatus for a remote-controlled device and a remote controller. With the invention, the user can use the remote controller to control the remote-controlled device's motion with a terrestrial magnetism self-sense capability.

According to the invention, the remote-controlled device is controlled by a remote controller. The remote controller transmits a target motion signal to the remote-controlled device. The remote-controlled device comprises a communication module, a terrestrial magnetism sensing module, a processing module and a driving module. The communication module receives the target motion signal from the remote controller, the terrestrial magnetism sensing module detects the terrestrial magnetism of the remote-controlled device and outputs an terrestrial magnetism sensing signal, the processing module connects to the terrestrial magnetism sensing module and the communication module, and compares the terrestrial magnetism sensing signal and the target motion signal to output a driving control signal, the driving module connects to the processing module and receives the driving control signal, and adjusts the motion drivers of the remote-controlled device according to the driver control signal.

According to the invention, a remote controller controls a remote-controlled device, the remote controller comprises a terrestrial magnetism sensing module and a communication module, the terrestrial magnetism sensing module detects the terrestrial magnetism of the remote controller and outputs a terrestrial magnetism sensing signal, the communication module connects to the terrestrial magnetism sensing module and, in a first operating mode, the remote controller transmits a first target motion signal according to the terrestrial magnetism sensing signal, and the remote-controlled device, which detects its own terrestrial magnetism, refers to its own terrestrial magnetism sensing signal to adjust and keep its detected terrestrial magnetism to align with the first target motion signal. The communication module, in a second operation mode, transmits a second target motion signal according to the terrestrial magnetism sensing signal, and the remote-controlled device, which detects its own terrestrial magnetism, refers to its own terrestrial magnetism sensing signal to adjust and keep its moving velocity in the direction of motion to align with the first target motion signal.

According to the invention, a remote controller controls a remote-controlled device, the remote controller comprises a manual input module and a communication module, the manual input module comprises at least one direction control unit to output a direction control signal, the communication module connects to the manual input module and, in a first operation mode, transmits a first target motion signal according to the direction control signal, and the remote-controlled device, which detects its own terrestrial magnetism, refers to its own terrestrial magnetism sensing signal to adjust and keep its detected terrestrial magnetism to align with the first target motion signal. The communication module, in a second operation mode, transmits a second target motion signal according to the terrestrial magnetism sensing signal, and the remote-controlled device, which detects its own terrestrial magnetism, refers to its own terrestrial magnetism sensing signal to adjust and keep its moving velocity in the direction of motion to align with the first target motion signal.

In summary, in the invention, the remote-controlled device detects its own terrestrial magnetism and uses the terrestrial magnetism data as a controlling feedback, and by synchronizing its detected terrestrial magnetism with the target motion signal from the remote controller, the motion of the remote-controlled device is synchronized with the motion of the remote controller. The invention makes the remote control operation become an easy task, and greatly reduces the risk of out of control situation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
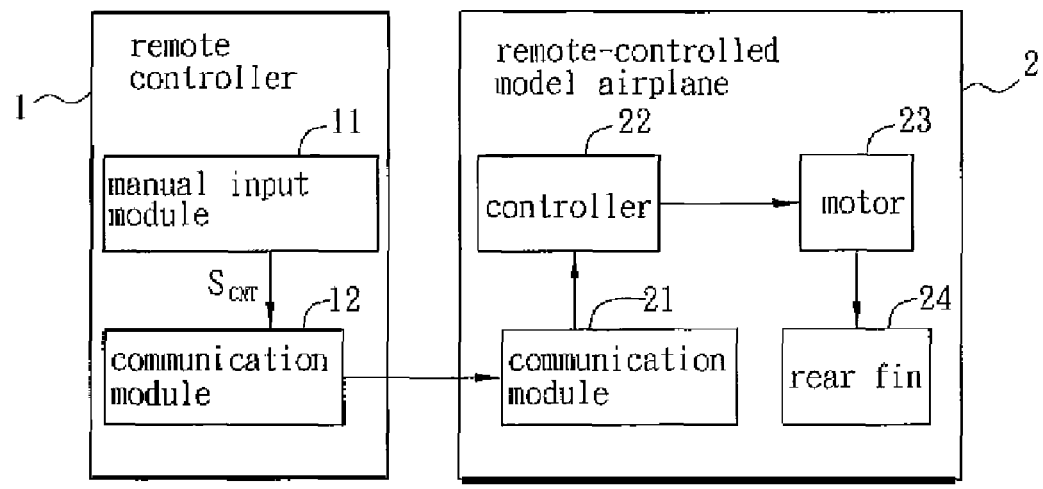
FIG. 1 is a system diagram showing a remote control system of the prior art.
Figure 2:
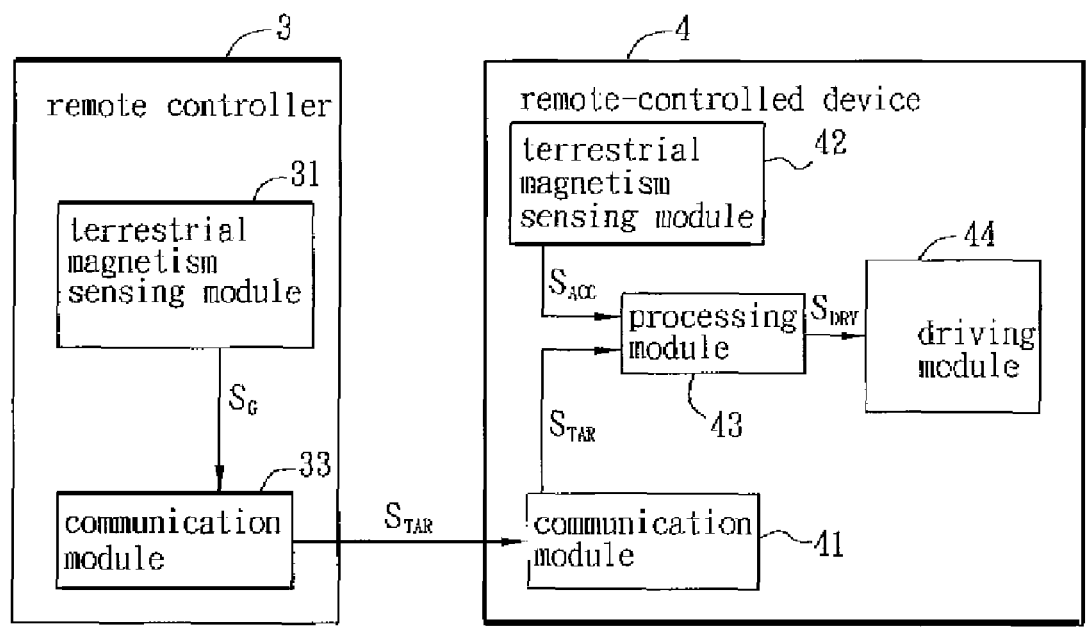
FIG. 2 is a system diagram of a remote control system according to the preferred embodiment of the invention.

Referring to FIG. 2, the remote controller 3 transmits a target motion signal $S_{TAR}$ to control the motion of remote-controlled device 4.

The remote-controlled device 4 consists of a communication module 41, a terrestrial magnetism sensing module 42, a processing module 43 and a driving module 44. The communication module 41 receives the target motion signal $S_{TAR}$ from the remote controller 3, the terrestrial magnetism sensing module 42 detects the terrestrial magnetism of the remote-controlled device 4 and outputs an terrestrial magnetism sensing signal $S_{ACC}$, the processing module 43 connects to the terrestrial magnetism sensing module 42 and the communication module 41, and outputs a driving control signal $S_{DRV}$ after processing the terrestrial magnetism sensing signal $S_{ACC}$ and the target motion signal $S_{TAR}$, the driving module 44 connects to the processing module 43 and receives the driving control signal $S_{DRV}$, and controls the motion of the remote-controlled device 4 according to the driving control signal $S_{DRV}$.

In the preferred embodiment of the invention, the remote controller 3 consists of a terrestrial magnetism sensing module 31 and a communication module 33, the terrestrial magnetism module 31 detects the terrestrial magnetism of the remote controller 3 and outputs an terrestrial magnetism sensing signal $S_G$, the communication module 33 connects to the terrestrial magnetism module 31 and transmits a target motion signal $S_{TAR}$ according to the terrestrial magnetism sensing signal $S_G$, the target motion signal $S_{TAR}$ is used to control the remote-controlled device 4 to keep its detected terrestrial magnetism to align with the target motion signal $S_{TAR}$. The terrestrial magnetism sensing signal $S_G$ is used to represent the terrestrial magnetism information of the remote controller 3.

The terrestrial magnetism sensing module 31 consists of a magnetic sensor to detect the remote controller's terrestrial magnetism in the X, Y and Z axes. Since the terrestrial magnetism of the earth directs to a fixed direction parallel to the horizontal ground surface, when the remote controller 3 is held by the user and is moved with a motion related to the horizontal ground surface, the terrestrial magnetism sensing module 31 will detect a change in the terrestrial magnetism since the remote controller body's angle or position to the ground has been changed, so the resulting terrestrial magnetism sensing signal $S_G$ will be changed.

In the user's operation, the user holds the remote controller 3 and moves it or rotate it, the terrestrial magnetism sensing module 31 in the remote controller 3 will detect a change in terrestrial magnetism, and accordingly outputs an terrestrial magnetism sensing signal $S_G$, the terrestrial magnetism sensing signal $S_G$ provides the communication module 33 a reference to transmit the target motion signal $S_{TAR}$ to control the remote-controlled device 4. For example, the terrestrial magnetism sensing signal $S_G$ contains three voltage levels to represent the terrestrial magnetism of X, Y and Z axes, the three voltage levels can be converted and transmitted by the communication module 33 (such as using radio transmission with the PCM coding technique). The user can even use only one band to operate the remote controller 3 and generate the 3-D X, Y and Z axes target notion signal $S_{TAR}$.

The terrestrial magnetism sensing module 42 includes a magnetic sensor to detect the terrestrial magnetism of the remote-controlled device 4 and outputs a terrestrial magnetism sensing signal $S_{ACC}$. Similar to the remote controller 3, the terrestrial magnetism sensing module 42 can detect a change in the terrestrial magnetism due to the motion of the remote-controlled device 4, and the processing module 43 compares the terrestrial magnetism sensing signal $S_{ACC}$ with the target motion signal $S_{TAR}$ and generates a driving control signal $S_{DRV}$ to control the motors or servo units and makes the remote-controlled device 4 to generate a synchronized motion with the remote controller 3. For example, the terrestrial magnetism sensing signal $S_{ACC}$ and the target motion signal $S_{TAR}$ both include three data of voltage levels which represent the three terrestrial magnetism values in X, Y and Z axes, and the processing module 43 can directly compare these data of voltage levels to generate the driving control signal $S_{DRV}$.

In the preferred embodiment of the invention, the target motion signal $S_{TAR}$ includes the terrestrial magnetism information of the remote controller 3, the terrestrial magnetism information includes the magnetism direction information in it. According to the terrestrial magnetism sensing signal $S_{ACC}$, the processing module 43 can calculate the motion direction of the remote-controlled device 4. The processing module 43 compares the terrestrial magnetism sensing signal $S_{ACC}$ and the target motion signal $S_{TAR}$, calculates their terrestrial magnetism differences, and uses the difference data to output the corresponding driving control signal $S_{DRV}$.

To reduce the terrestrial magnetism differences, the driving control signal $S_{DRV}$ is output to the driving module 44 to adjust the motion of the remote-controlled device 4, as a result the remote-controlled device 4's motion will be synchronized with the remote controller 3, which means the remote-controlled device 4 has the ability of self-adjustment in the motion and is controlled in a closed-loop real-time feedback mode, this makes the remote control an easier job than before.

The communication module 41 comprises a receiver to receive the target signal from the remote controller 3, and transfers the target signal into a base-band signal. The processing module comprises a microcontroller, or a microprocessor, or a digital signal processor, or a comparator circuit. In advance, the processing module can comprise a memory unit to store a look-up table of the relationship between the terrestrial magnetism and the motion, and the processing module can use the look-up table to calculate the motion of the remote-controlled device 4 from the input of the terrestrial magnetism sensing signal $S_{ACC}$.

The remote-controlled device 4 can be a remote-controlled airplane (fixed-wing aircraft), or a remote-controlled helicopter, or a remote-controlled car or a remote-controlled robot. In most cases the remote-controlled airplane comprises at least one wing and at least one driving unit. The driving unit is connected to the processing module to receive the driving control signal, and adjusts the pitch of the wing according to the driving control signal. The wing could be a main wing, or a horizontal stabilizer or a vertical stabilizer. The remote-controlled helicopter comprises at least one rotor and at least one driving unit, the driving unit is connected to the processing module to receive the driving control signal, and adjusts the rotor's rotating speed or the pitch, the rotor is a horizontal rotor or a tail rotor. The driving unit could be a motor or a servo or the like.

The following descriptions use a remote-controlled airplane and a remote-control helicopter as the examples.

Figure 3:
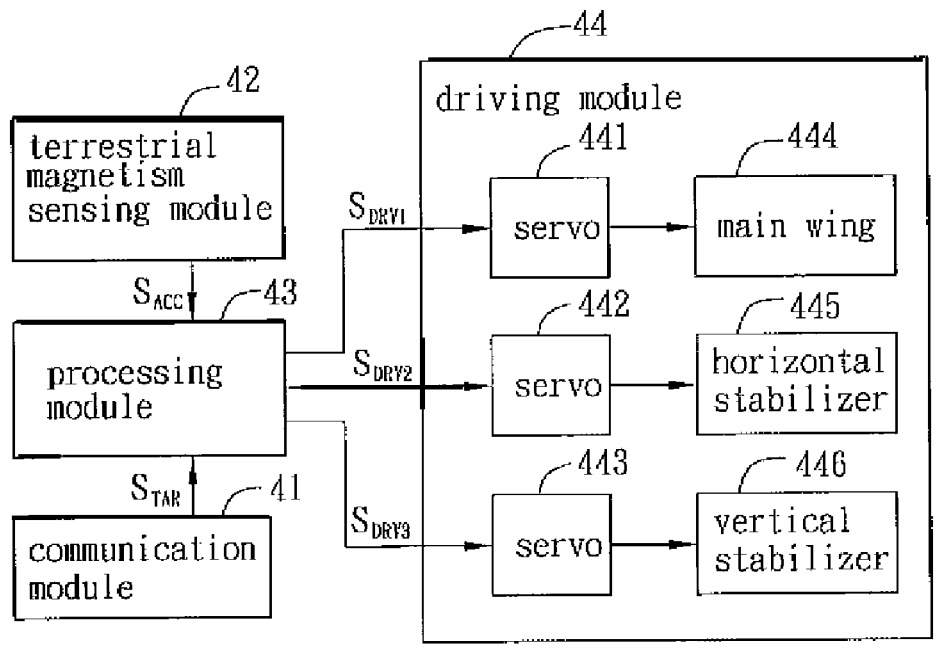
FIG. 3 and FIG. 4 is a block diagram of the remote-controlled device in the FIG. 2.

Referring to FIG. 3, the remote-controlled device 4 is a remote-controlled airplane. The driving module 44 includes three servos 441~443, a main wing 444, a horizontal stabilizer 445 and a vertical stabilizer 446. The processing module 43 connects to the servos 441~443, the processing module 43 receives and calculates the differences of the terrestrial magnetism sensing signal $S_{ACC}$ and the target motion signal $S_{TAR}$, and outputs the driving control signals $S_{DRV1}$~$S_{DRV3}$ to control the servos 441~443 and adjust the main wing's ailerons and the angles of the vertical and horizontal stabilizers, and so the motion of the remote-controlled device 4 is controlled.

As the remote controller 3 is held and moved with a motion in the roll or pitch direction, the processing module 4 will output the driving control signal $S_{DRV1}$, $S_{DRV2}$ and $S_{DRV3}$, which control the servos 441, 442 and 443 correspondingly, to change the ailerons of the main wing 444, the angle of the horizontal stabilizer 445 and the vertical stabilizer 446. The roll and pitch motion of the remote-controlled device 4 is thus adjusted and synchronized with the motion of the remote controller 3.

When the remote-controlled device 4's motion is gradually aligned with the remote controller 3, the differences between the received target motion signal $S_{TAR}$ and the detected terrestrial magnetism sensing signal $S_{ACC}$ from the terrestrial magnetism sensing module 42 will become smaller or zero, the output driving control signal $S_{DRV1}$, $S_{DRV2}$ and $S_{DRV3}$ from the processing module will then be kept at a value to keep the motion aligned. In the example, the terrestrial magnetism sensing signal $S_{ACC}$ plays like a feedback signal for the processing module 43 to control the servos 441, 442 and 443 to gradually adjust the ailerons of the main wing 444 and the angles of the horizontal stabilizer 445 and vertical stabilizer 446, and finally aligns the roll and pitch motion of the remote-controlled device 4 with the remote controller 3. The motion control is thus completed in a closed-loop real time feedback system.

Figure 4:
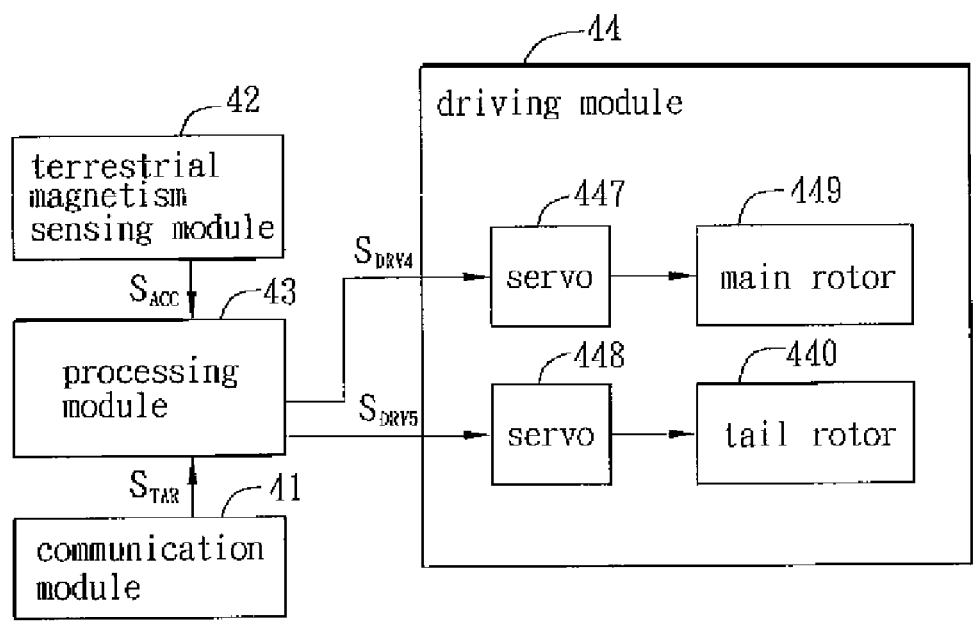

Referring to FIG. 4, the remote-controlled device 4 is a remote-controlled helicopter, the driving module 44 comprises two servos 447 and 448, a main rotor 449 and a tail rotor 440, the servos 447 and 448 is connected to the processing module 43 to receive the driving control signal $S_{DRV4}$ and $S_{DRV5}$, and to adjust the pitch of the main rotor 449 and the tail rotor 440 to control the motion of the remote-controlled device 4. The basic control theory is quite the same with the remote-controlled airplanes as described in the previous sections. The motion of the remote-controlled helicopter is thus controlled in a closed-loop real time feedback system.

In the preferred embodiment, the remote controller 3 does not need a complicated control stick system, the user can hold the remote controller 3 by only one hand and generate a real 3D control signal, and the remote-controlled device 4 can be automatically synchronized with the motion of the remote controller 3, as a result the controlling of the remote-controlled device 4 becomes very easy and straight forward, and the risk of going into out of control situation is greatly reduced.

Figure 5:
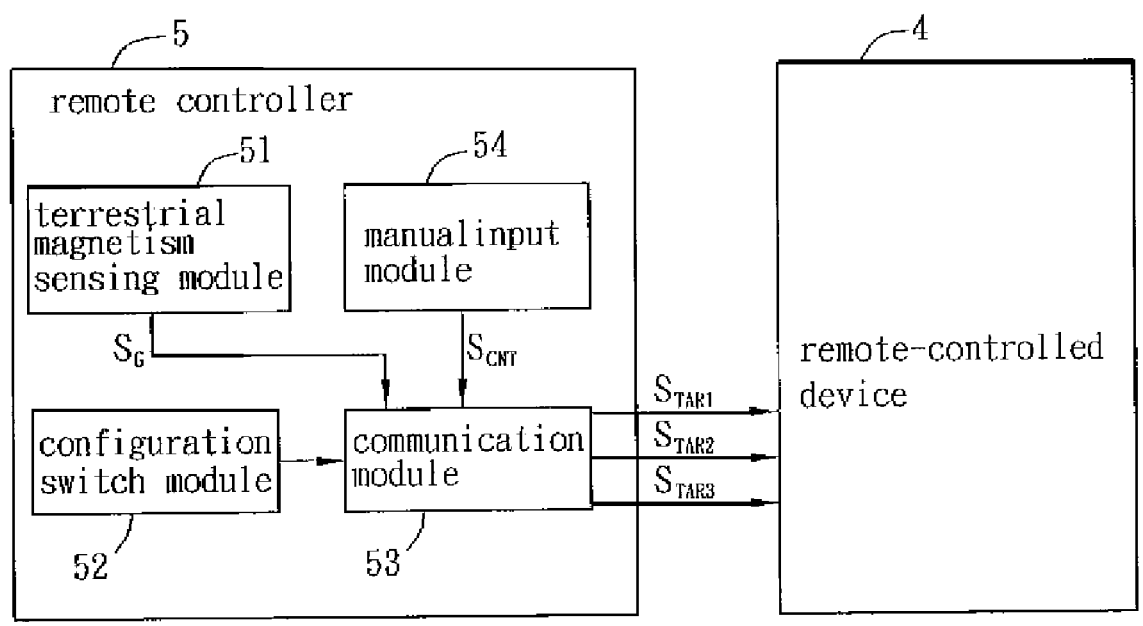
FIG. 5 is another system diagram of a remote control system according to the preferred embodiment of the invention.

In another preferred embodiment of the invention shown in FIG. 5, a remote controller 5 comprises an terrestrial magnetism sensing module 51, a communication module 53 and a manual input module 54. Different with the previous example, the remote controller 5 has three operation modes.

The first operation mode is the same with the previous example, the terrestrial magnetism sensing module 51 detects the terrestrial magnetism of the remote controller 5 and outputs a terrestrial magnetism sensing signal $S_G$, the communication module 53 connects to the terrestrial magnetism sensing module 51 and transmits a first target motion signal $S_{TAR1}$ according to the terrestrial magnetism sensing signal $S_G$, the first target motion signal $S_{TAR1}$ controls the motion of the remote-controlled device 4 to align with the terrestrial magnetism sensing signal $S_G$. As so, the remote-controlled device 4 detects its own terrestrial magnetism and receives the first target motion signal $S_{TAR1}$ to align itself with the terrestrial magnetism sensing signal $S_G$. The detailed operation is the same and can be found in the previous examples. In short, the first operation mode uses the terrestrial magnetism sensing signal $S_G$ and the first target motion signal $S_{TAR1}$ to control the motion of the remote-controlled device 4.

In a second operation mode, the manual input module 54, which comprises at least one direction control unit, outputs a direction control signal $S_{CNT}$. The communication module 53 connects to the manual input module 54 and transmits a second target motion signal $S_{TAR2}$ according to the direction control signal $S_{CNT}$, and the second target motion signal $S_{TAR2}$ controls the motion of the remote-controlled device 4. In short, the second operation mode uses the direction control signal $S_{CNT}$ and the second target motion signal $S_{TAR2}$ to control the motion of the remote-controlled device 4.

In a third operation mode, the communication module 53 transmits a third target motion signal $S_{TAR3}$ according to the terrestrial magnetism sensing signal $S_G$ and the direction control signal $S_{CNT}$, the third target motion signal $S_{TAR3}$ is used to control the motion of the remote-controlled device 4 to align with both the terrestrial magnetism sensing signal $S_G$ and the direction control signal $S_{CNT}$. So the remote-controlled device 4 detects its own terrestrial magnetism and receives the third target motion signal $S_{TAR3}$ to align itself with the motion of the remote controller 5. In short, the third operation mode uses the terrestrial magnetism sensing signal $S_G$, the direction control signal $S_{CNT}$ and the third target motion signal $S_{TAR3}$ to control the motion of the remote-controlled device 4.

Furthermore, the remote controller 5 comprises a configuration switch module 52. The configuration switch module 52 selects the mode of operation, which means it selects the terrestrial magnetism sensing module 51 and/or the manual input module 54 as the input for the communication module 53.

And when the configuration switch module 52 switches the selection between the terrestrial magnetism sensing module 51 and the manual input module 54, the communication module 53 can transmit commands to inform the remote-controlled device 4 about the selection.

Figure 6:
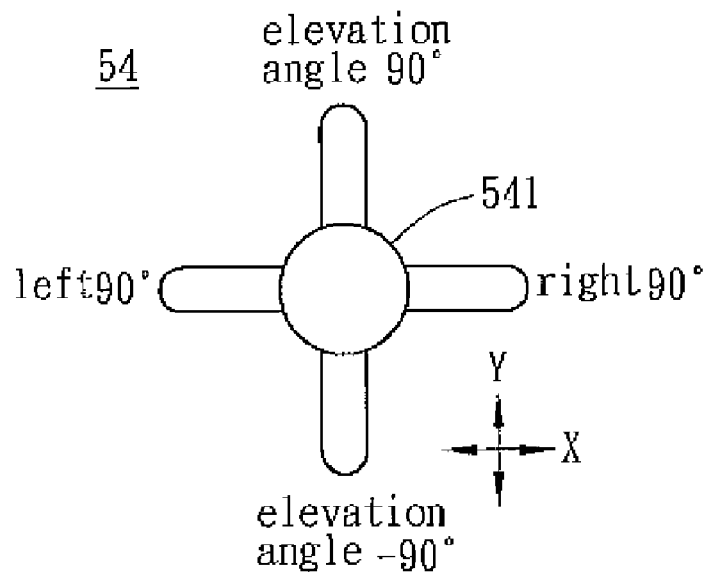
FIG. 6 and FIG. 7 is a diagram of the manual input module in the FIG. 5.
Figure 7:
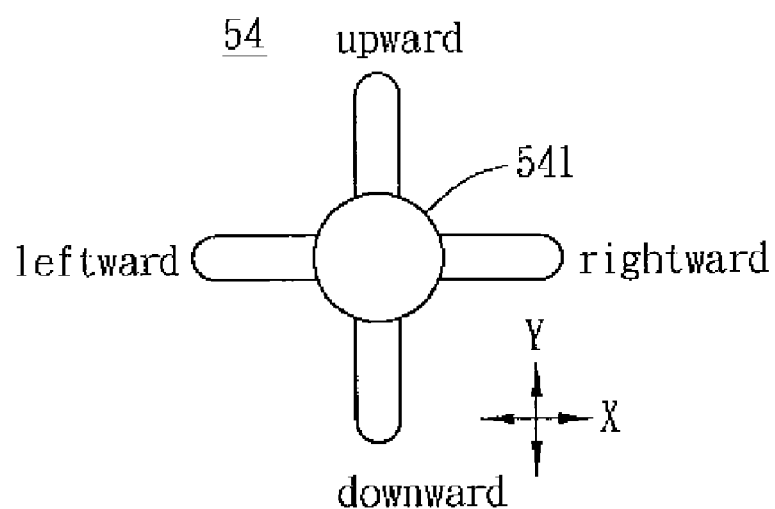

Referring to FIG. 6 and FIG. 7, an example of the manual input module 541 is shown. The manual input module 54 has a direction control stick 541. Referring to FIG. 6, which is an example for the remote-controlled airplane in the second operation mode, the Y direction offset of the control stick 541 controls the remote-controlled airplane's pitch, and the X direction offset controls the remote-controlled airplane's roll. When the control stick 541 is in its neutral center position, the remote-controlled airplane is controlled at a flying position parallel to the horizontal ground surface. When the user pushes the stick backward, the airplane climbs up. When the user pushes the stick forward, the airplane dives. When the user pushes the stick left or right, the airplane rolls left or right.

Referring to FIG. 7, which is an example for the remote-controlled helicopter, the Y direction offset of the control stick 541 represents the desired pitch for the horizontal rotor, and the X direction offset represents the desired pitch for the tail rotor. When the user pushes the stick backward, the helicopter descends. When the user pushed the stick forward, the helicopter ascends. When the user pushes the stick left or right, the helicopter turns left or right.

Figure 8:
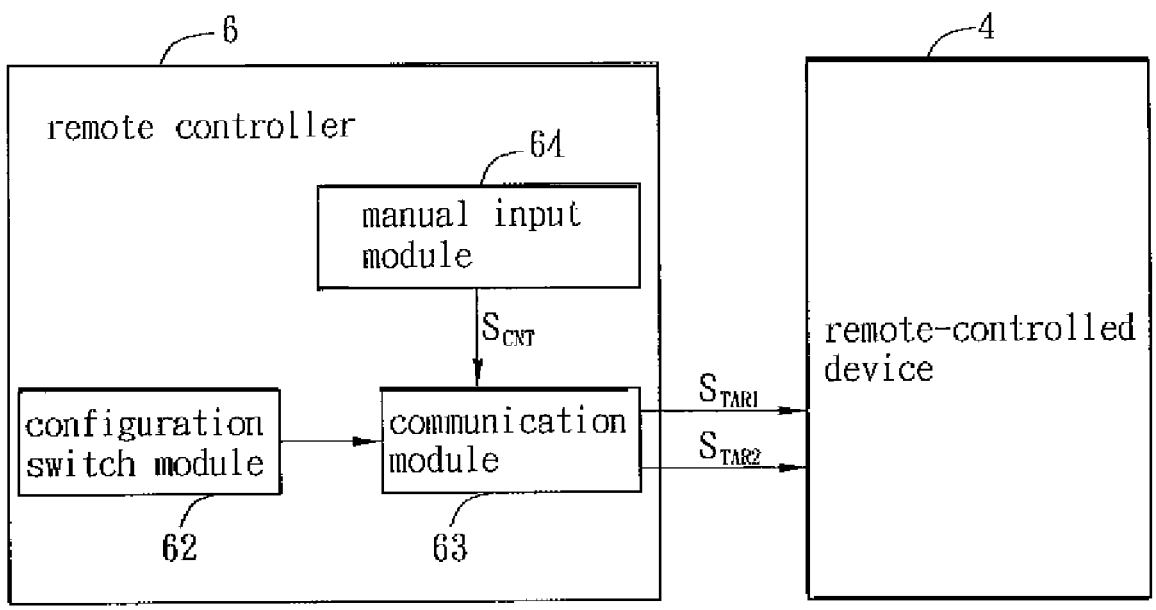
FIG. 8 is another system diagram of a remote control system according to the preferred embodiment of the invention.

Referring to FIG. 8, in another preferred embodiment of the invention, the remote controller 6 comprises a manual input module 64, a configuration switch module 62 and a communication module 63, in different with the FIG. 5, the remote controller 6 does not have the terrestrial magnetism sensing module, but simply use the manual input module 64 to provide two different operation modes.

In this example, the communication module 63 connects to the manual input module 64, and in a first operation mode a first target motion signal $S_{TAG1}$ is transmitted according to the direction control signal $S_{CNT}$, the remote-controlled device 4 detects its own terrestrial magnetism and compares with the received first target motion signal $S_{TAG1}$, and according to the comparison result to control its motion to keep aligned with the direction control signal $S_{CNT}$. In this mode the target motion signal $S_{TAG1}$ is an absolute terrestrial magnetism value to the remote-controlled device 4. In a second operation mode a second target motion signal $S_{TAG2}$ is transmitted according to the direction control signal $S_{CNT}$, the remote-controlled device 4 takes the second target motion signal $S_{TAG2}$ as a moving velocity to be fulfilled in the direction of motion, as a result the remote-controlled device will continue its movement in the desired direction until the second target motion signal $S_{TAG2}$ returns to a neutral or zero value. In this mode the target motion signal $S_{TAG2}$ is a relative terrestrial magnetism value to the remote-controlled device 4. And the detailed operation of motion in the remote-controlled device 4 is the same with the previous examples.

According to the above descriptions, in the remote-controlled device with terrestrial magnetism self-sense ability and the remote controller of the invention, the remote-controlled device can detect its own terrestrial magnetism to form a closed-loop real-time feedback, and synchronize its motion with the target motion signal from the remote controller, which makes the operation of the remote controller becomes simple, straight forward and no need to count on the user's visual feedback, and thus greatly reduces the risk of out of control situation.

Although the invention has been described with reference to specific embodiments, this description is not meant to be constructed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A remote control system, comprising:
    a remote controller, comprising:
        a motion detecting module, which detects the remote controller's motion and outputs a motion detecting signal; and
        a first communication module, which connects to the motion detecting module and receives the motion detecting signal, and transmits a target motion signal according to the motion detecting signal; and
    a remote-controlled device, which is controlled by the remote controller, comprising:
        a second communication module, which receives the target motion signal from the remote controller;
        a terrestrial magnetism sensing module, which detects the remote-controlled device's terrestrial magnetism and outputs a terrestrial magnetism sensing signal;
        a processing module, which has a first input connected to the terrestrial magnetism sensing module and receives the terrestrial magnetism sensing signal, and a second input connected to the second communication module and receives the target motion signal, and processes the terrestrial magnetism sensing signal and the target motion signal to output a driving control signal; and
        a driving module, which connects to the processing module and receives the driving control signal, and adjusts the remote-controlled device's motion according to the driving control signal.

2. The remote control system of claim 1, wherein the processing module processes the terrestrial magnetism sensing signal and compares with the target motion signal, and uses the comparison result to generate the driving control signal.

3. The remote control system of claim 1, wherein the terrestrial magnetism sensing module comprises a magnetic sensor, the magnetic sensor detects the remote-controlled device's terrestrial magnetism to output the terrestrial magnetism sensing signal.

4. The remote control system of claim 1, wherein the processing module uses the terrestrial magnetism sensing signal to calculate the current motion of the remote-controlled device, and uses the calculated result to compare with the target motion signal to get the difference of motion between the remote-controlled device and the remote controller, and according to the difference to output the driving control signal.

5. The remote control system of claim 1, wherein the remote-controlled device is a remote-controlled model airplane, or a remote-controlled model helicopter, or a remote-controlled model car, or a remote-controlled robot.

6. The remote control system of claim 1, wherein the driving module comprising:
    a wing of an airplane; and
    a driving unit, which connects to the processing module and receives the driving control signal to drive and adjust the pitch of the wing.

7. The remote control system of claim 6, wherein the wing is a main wing, or a horizontal stabilizer or a vertical stabilizer of an airplane.

8. The remote control system of claim 1, wherein the driving module comprising:
    a rotor of a helicopter; and
    a driving unit, which connects to the processing module and receives the driving control signal to drive and adjust the rotation speed or the pitch of the rotor.

9. The remote control system of claim 8, wherein the rotor is a main rotor or a tail rotor of a helicopter.

10. The remote control system of claim 1, wherein the second communication module comprising a radio receiver which receives the target motion signal from the remote controller and converts the radio signal into baseband signal.

11. The remote control system of claim 1, wherein the processing module comprising a microcontroller, or a microprocessor, or a digital signal processor, or a comparator circuit.

12. The remote control system of claim 1, wherein the motion detecting module comprises a magnetic sensor, which detects the terrestrial magnetism of the remote controller to generate the motion detecting signal.

13. The remote control system of claim 1, wherein the motion detecting signal represents the information of the remote controller's motion in the 3D space.

14. The remote control system of claim 12, wherein the motion detecting module further comprises a manual input module which has at least one direction input device to generate the motion detecting signal.

15. The remote control system of claim 14, wherein the motion detecting module further comprises a configuration switch module to select between the terrestrial magnetism detecting module and/or the manual input module as the input of the communication module.

* * * * *